United States Patent
Iwata

(10) Patent No.: US 8,428,917 B2
(45) Date of Patent: Apr. 23, 2013

(54) SIGNAL PROCESSING DEVICE AND SIGNAL PROCESSING METHOD

(75) Inventor: Kazuya Iwata, Osaka (JP)

(73) Assignee: Panasonic Corporation, Osaka (JP)

( * ) Notice: Subject to any disclaimer, the term of this patent is extended or adjusted under 35 U.S.C. 154(b) by 1010 days.

(21) Appl. No.: 12/515,362

(22) PCT Filed: Nov. 19, 2007

(86) PCT No.: PCT/JP2007/072368
§ 371 (c)(1),
(2), (4) Date: May 18, 2009

(87) PCT Pub. No.: WO2008/062748
PCT Pub. Date: May 29, 2008

(65) Prior Publication Data
US 2010/0070058 A1    Mar. 18, 2010

(30) Foreign Application Priority Data
Nov. 20, 2006    (JP) ................................ 2006-312595

(51) Int. Cl.
G06F 17/50    (2006.01)

(52) U.S. Cl.
USPC .......... 703/2; 703/6; 703/18; 700/94; 381/61; 323/355

(58) Field of Classification Search ............... 703/2, 6, 703/18; 381/61; 700/94; 323/355
See application file for complete search history.

(56) References Cited

U.S. PATENT DOCUMENTS

| | | | | |
|---|---|---|---|---|
| 5,636,284 A | * | 6/1997 | Pritchard | 381/61 |
| 5,734,725 A | * | 3/1998 | Pritchard | 381/61 |
| 5,761,316 A | * | 6/1998 | Pritchard | 381/61 |
| 5,761,317 A | * | 6/1998 | Pritchard | 381/61 |
| 6,175,271 B1 | | 1/2001 | Mieda et al. | |
| 6,229,387 B1 | * | 5/2001 | Mieda et al. | 330/3 |
| 6,812,788 B2 | * | 11/2004 | Kern | 330/69 |
| 7,242,177 B2 | * | 7/2007 | Maier et al. | 324/126 |
| 2004/0258250 A1 | | 12/2004 | Gustafsson et al. | |

FOREIGN PATENT DOCUMENTS

| | | |
|---|---|---|
| EP | 0 923 194 | 6/1999 |
| EP | 1 492 081 | 12/2004 |
| JP | 6-342287 | 12/1994 |
| JP | 7-86840 | 3/1995 |
| JP | 2000-31754 | 1/2000 |
| JP | 2002-135893 | 5/2002 |
| JP | 2003-108137 | 4/2003 |
| JP | 2004-88358 | 3/2004 |
| JP | 2005-20740 | 1/2005 |

OTHER PUBLICATIONS

International Search Report issued Feb. 19, 2008 in the International (PCT) Application No. PCT/JP2007/072368.
International Preliminary Report on Patentability issued May 26, 2009 in International (PCT) Application No. PCT/JP2007/072368.

* cited by examiner

*Primary Examiner* — Thai Phan
(74) *Attorney, Agent, or Firm* — Wenderoth, Lind & Ponack, L.L.P.

(57) ABSTRACT

A signal processing device includes a transformer simulator for simulating transfer characteristic of a transformer which changes in frequency characteristic depending on a load connected to the transformer and processing an input signal with the transfer characteristic to output the processed signal, and a load impedance simulator for simulating impedance characteristic of a predetermined load to output the impedance characteristic. The transformer simulator simulates the transfer characteristic of the transformer to which the load having the load impedance which is simulated by the load impedance simulator is connected.

14 Claims, 18 Drawing Sheets

SIGNAL PROCESSING DEVICE AND SIGNAL PROCESSING METHOD

TECHNICAL FIELD

The present invention relates to a signal processing device and a signal processing method for enabling a digital audio apparatus to regenerate tone feature of an analog audio apparatus, especially a vacuum tube amplifier.

BACKGROUND ART

Regarding a sound effect device for a musical instrument, a signal processing apparatus designed to regenerate features of timbre of a vacuum tube type guitar amplifier, especially timbre changes occurring when an excessive input is applied, is disclosed in patent document 1. FIG. 18 shows a configuration of the signal processing apparatus. The signal processing apparatus shown in FIG. 18 includes Ig blocks 301 and 302, Ip/Eg blocks 305 and 306, a level detector 308, a multiplier 309, and adders 303, 304, 307 and 310.

The Ig blocks 301 and 302 simulate the characteristics of a filter connected to the grid of a vacuum tube type power amplifier according to the input signal. The output signals from the Ig blocks 301 and 302 are supplied to the Ip/Eg blocks 305 and 306. The Ip/Eg blocks 305 and 306 simulate a plate current which changes depending on changes in the grid voltage in the vacuum tube type power amplifier.

The Ig blocks 301 and 302 has cut off characteristic becoming higher as the input voltage increases. The level detector 308 detects the output level obtained from the adder 307 adding the output level of the Ip/Eg block 305 and the output level of the Ip/Eg block 306. The operation of the vacuum tube amplifier is simulated by increasing the bias of the Ip/Eg blocks 305 and 306 by using the multiplier 309 and the adders 310, 303 and 304, as the added output level becomes larger.

As discussed above, according to the patent document 1, the characteristics of the filter connected to the grid of the vacuum tube type power amplifier and the statistic characteristic of the plate current are simulated depending on the input signal, and the bias to be added to the filter characteristic and the input signal is changed depending on the output signal level. As a result, the characteristic of the vacuum tube amplifier can be simulated, and the timbre of a vacuum tube type guitar amplifier, especially timbre changes occurring when an excessive input is applied can be regenerated.
Patent document 1: JP-A-07-86840

DISCLOSURE OF THE INVENTION

The above-stated conventional signal processing apparatus has a purpose to regenerate the feature of timbre of a vacuum tube type guitar amplifier, especially timbre changes occurring when an excessive input is provided. Accordingly, no effect is obtained on ordinary amplitude signals (with signal amplitude enabling operation in substantial distortion-free state). Thus it is not suited to audio applications handling ordinary amplitude signals.

The present invention is devised to solve the problem, and it is hence an object thereof to present a signal processing apparatus and a signal processing method for enabling a digital audio apparatus to regenerate the sound quality feature of an analog audio apparatus, especially a vacuum tube amplifier, thus regenerating sound quality that can be felt from sound by an analog audio apparatus, such as deep, smooth, stable, and easeful sound in low and medium frequency range.

A signal processing device according to the invention includes a transformer simulator for simulating transfer characteristic of a transformer which changes in frequency characteristic depending on a load connected to the transformer and processing an input signal with the transfer characteristic to output the processed signal, and a load impedance simulator for simulating impedance characteristic of a predetermined load to output the impedance characteristic. The transformer simulator simulates the transfer characteristic of the transformer to which the load having the load impedance which is simulated by the load impedance simulator is connected.

A signal processing method according to the invention includes the steps of simulating impedance characteristic of a predetermined load to output the impedance characteristic, simulating transfer characteristic of a transformer which changes in frequency characteristic depending on a load connected to the transformer, and processing an input signal with the simulated transfer characteristic to generate an output signal.

According to the invention, the input audio signal is processed by transfer characteristic with a transformer having predetermined characteristics connected to a load having predetermined characteristics to generate an audio signal. Especially with the entire transfer characteristics including the transfer characteristics of the output transformer and the impedance characteristic of the speaker connected the output transformer, the input audio signal is processed to generate an output audio signal. Accordingly, the sound quality obtained when the speaker is driven by a vacuum tube amplifier may be regenerated by taking an output transformer for audio vacuum tube amplifier as the transformer, and an audio speaker as the load.

| Reference Signs | |
|---|---|
| 101 | Output transformer simulator |
| 102 | Speaker impedance simulator |
| 201 | Vacuum tube device |
| 202 | Resistor |
| 203 | Output transformer |
| 204 | DC power source |
| 205 | Speaker |
| T1 | Input terminal |
| T2 | Output terminal |
| T3 | Input terminal |
| T11, T12 | Control terminal |

BEST MODE FOR CARRYING OUT THE INVENTION

The best mode for carrying out the invention is specifically described below with reference to the accompanying drawings.

1. Configuration of Signal Processing Device

Figure 1:
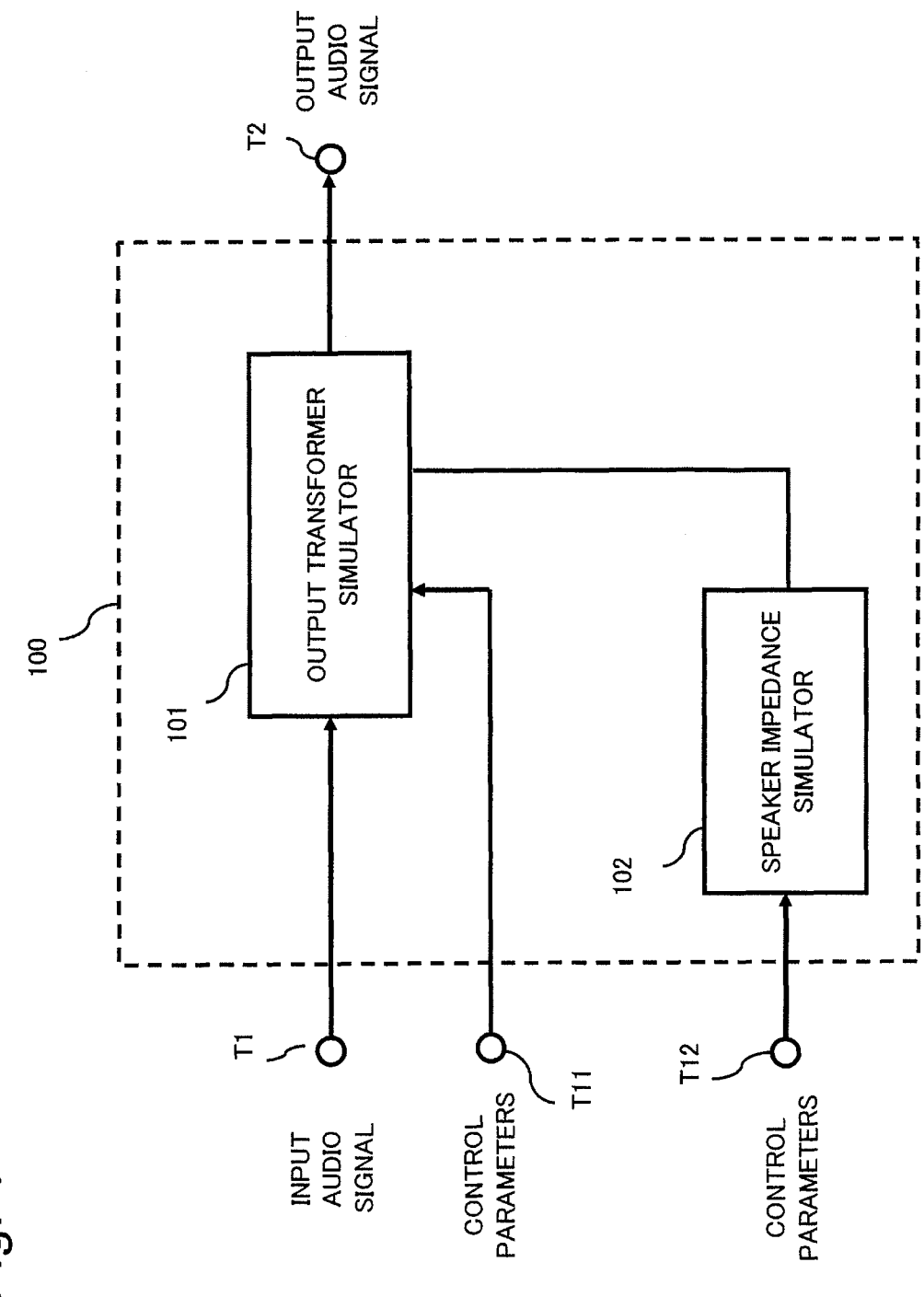
FIG. 1 is a block diagram of a signal processing apparatus in an embodiment of the present invention.

FIG. 1 is a block diagram of a signal processing apparatus in embodiment 1 of the present invention. In FIG. 1, a signal processing apparatus 100 includes an output transformer simulator 101, a speaker impedance simulator 102, an input terminal T1 for inputting a digital audio signal, and an output terminal T2 for outputting a digital audio signal processed in a predetermined signal processing. Further, the signal processing apparatus 100 includes a control circuit T11 for changing setting about simulation in the output transformer simulator 101, and a control terminal T12 for changing setting about simulation in the speaker impedance simulator 102.

The signal processing apparatus 100 of the embodiment has a filtering function for simulating the output characteristic (transfer characteristic) of an audio power amplifier using a vacuum tube (hereinafter referred to as "a vacuum tube amplifier"), and applying the simulated output characteristic to the input signal to output the result. In particular, the inventor of the present application, focusing on an output transformer used in the vacuum tube amplifier as an element providing a significant effect on the sound quality of the vacuum tube amplifier, has discovered that the sound quality feature obtained from the vacuum tube amplifier can be regenerated by simulating the output characteristic of the output transformer.

The output characteristic of the output transformer depends on impedance of a load (for example, speaker) connected to the output transformer. In view of this, the output transformer simulator 101 simulates the output characteristic of the output transformer used in the vacuum tube amplifier, and the speaker impedance simulator 102 simulates the load impedance of the speaker connected to the output transformer. With this configuration, the audio digital signal passing through the signal processing apparatus 100 of the embodiment is added the characteristic of sound quality obtained from the vacuum tube amplifier and the speaker which are targets of simulation, so that sound quality which is smooth, stable and easeful could be obtained as if regenerated by a vacuum tube amplifier.

The signal processing apparatus 100 is composed of a semiconductor integrated circuit and has a function of simulating the transfer characteristic of the output transformer and the impedance characteristic of the speaker. More specifically, the signal processing apparatus 100 is composed of a DSP (digital signal processor) for executing a signal processing program capable of realizing the following functions.

The following explanation relates to an audio power amplifier (vacuum tube amplifier) including an output transformer to be simulated by the output transformer simulator 101.

Figure 2:
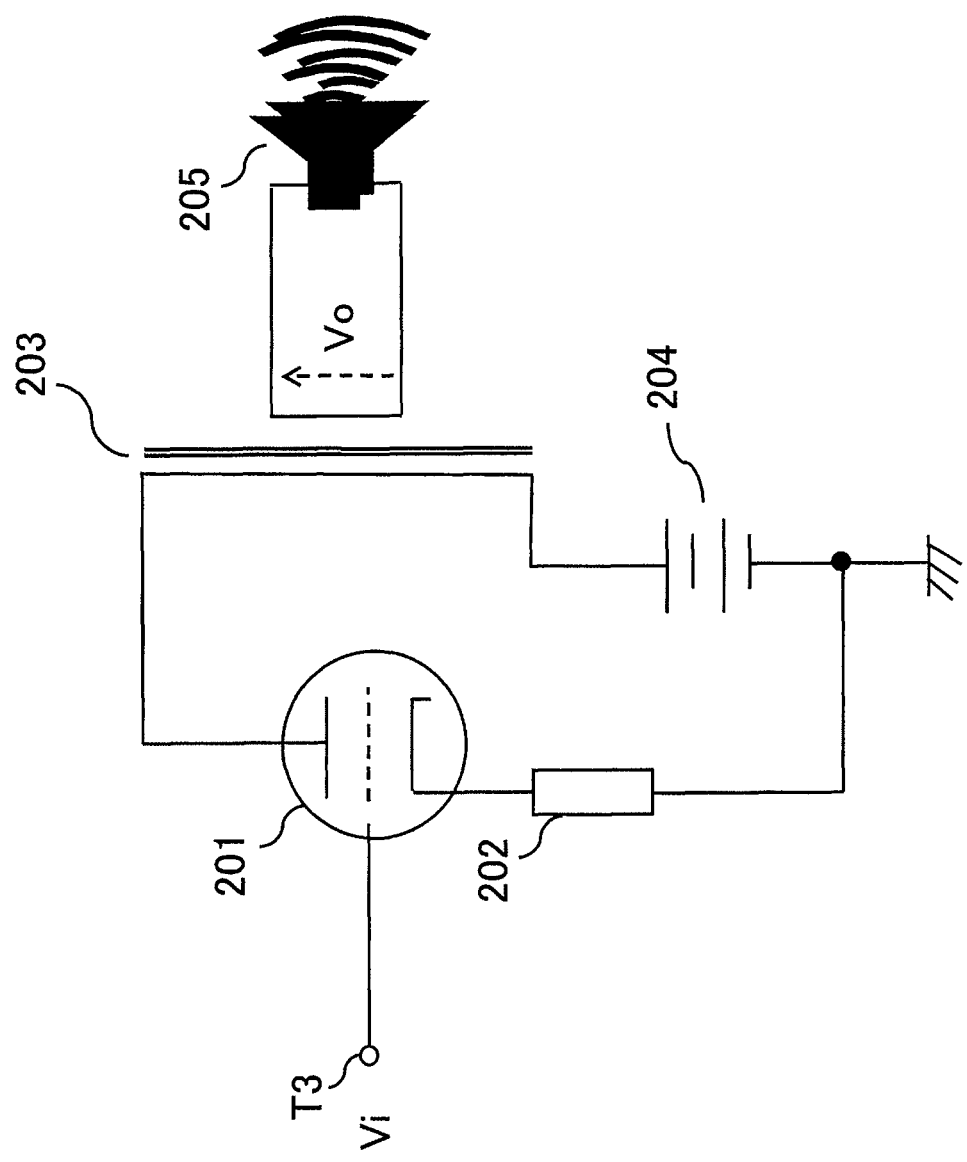
FIG. 2 is a block diagram of an audio power amplifier (vacuum tube amplifier) of single structure using a triode vacuum tube.

FIG. 2 shows a configuration of the audio power amplifier (vacuum tube amplifier) using one triode vacuum tube. The vacuum tube amplifier includes a vacuum tube device 201 for amplifying an audio signal, a resistor 202 for applying a bias to determine an operation point of the vacuum tube device 201, an output transformer 203, and a direct-current power source 204. The vacuum tube amplifier receives an analog audio signal from the input terminal T3 and sends out an amplified audio signal to the speaker 205 which is a load by way of the output transformer 203.

In the audio power amplifier, the audio signal input from the input terminal T3 is supplied to the vacuum tube device 201. The operation point of the vacuum tube device 201 is determined by the resistor 202, the output transformer 203, and the direct-current power source 204. The vacuum tube device 201 amplifies the input audio signal and supplies power to the speaker 205 as a load, by way of the output transformer 203. The output resistance of the vacuum tube device 201 is generally large, such as thousands of ohms, while the impedance of the speaker 205 is very small, such as 4 to 8 ohms. Hence the impedance should be matched by using the output transformer 203.

Generally, it is known that the output transformer has bandpass characteristic and its transfer characteristic is influenced by the load connected to the output transformer. The inventor of the present application has focused on that the characteristic of the output transformer affects the transfer characteristic of the vacuum tube amplifier to influence the sound quality of the vacuum tube amplifier. That is, the transfer characteristic of the output transformer with a speaker connected as a load is simulated and the input audio signal is processed with the simulated transfer characteristic, so that an audio signal including tone features of the vacuum tube amplifier is generated.

In this embodiment, the output transformer simulator 101 simulates the characteristic of the audio output transformer. Herein, the audio output transformer is inserted to match impedance between a speaker generally having small load impedance (4 to 16 ohms) and a vacuum tube amplifier. The characteristic of the audio output transformer is, for example, as follows.

TABLE 1

| | Frequency Response | Impedance (primary) | Impedance (secondary) | Primary Inductance |
|---|---|---|---|---|
| Transformer 1 | 10 Hz to 50 kHz (−1 dB) (input 4 V, rp = Zp) | 8 kΩ | 4, 8, 16 Ω | 130-280H |
| Transformer 2 | 6 Hz to 65 kHz (±1 dB) (input 4 V, rp = Zp) | 5 kΩ (6.7 kΩ) | 6 Ω (8 Ω) | 290-640H |
| Transformer 3 | 20 Hz to 75 kHz (−1 dB) (input 4 V, 2rp = Zp) | 8 kΩ | 4, 8, 16 Ω | 79-270H |
| Transformer 4 | 15 Hz to 100 kHz (−1 dB) (input 4 V, 2rp = Zp) | 8 kΩ | 4, 8, 16 Ω | 50-230H |
| Transformer 5 | 10 Hz to 60 kHz (−1 dB) (input 4 V, 2rp = Zp) | 8 kΩ | 4, 8, 16 Ω | 85-210H |
| Transformer 6 | 4 Hz to 50 kHz (−1 dB) (input 4 V, 2rp = Zp) | 8 kΩ | 4, 8, 16 Ω | 280-580H |

2. Operation of Signal Processing Apparatus

The operation of the signal processing apparatus 100 of the embodiment is explained. The output transformer simulator 101 simulates the transfer characteristic of the output transformer 203 included in the vacuum tube amplifier shown in FIG. 2. The speaker impedance simulator 102 simulates the impedance characteristic of the speaker 205 which is a load of the output transformer 203 shown in FIG. 2.

The output transformer simulator 101 receives an audio signal from the input terminal T1, processes the input audio signal based on the transfer characteristic of the output transformer 203 to output the processed audio signal from the output terminal T2. At this time, the output transformer simulator 101 utilizes the transfer characteristic of the output transformer 203 to which the speaker having the speaker impedance simulated by the speaker impedance simulator 102 is connected as a load.

Figure 3A:
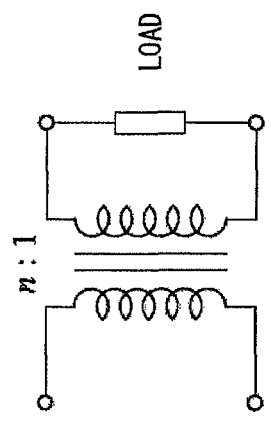
FIG. 3A is a circuit diagram of an output transformer, and 3B is an equivalent circuit diagram of the output transformer.
Figure 3B:
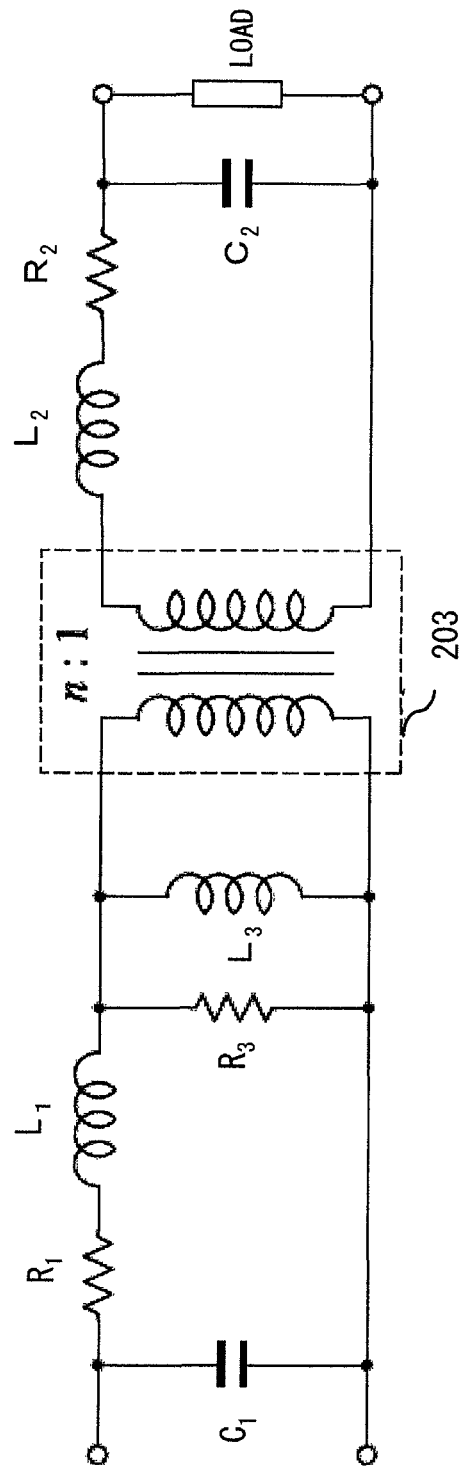
Figure 4:
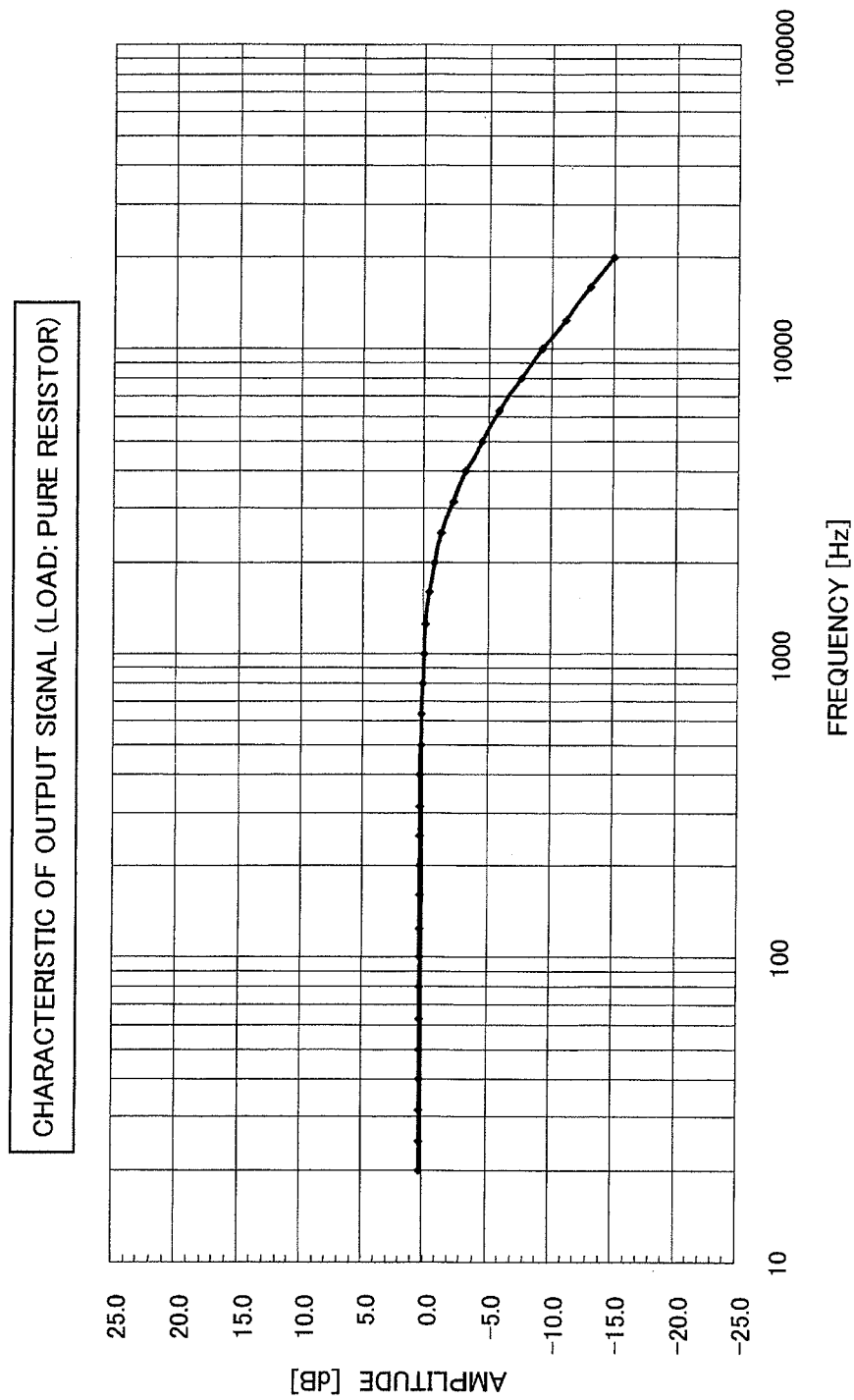
FIG. 4 is a diagram of an example of frequency characteristic of output signal of the output transformer with a pure resistance connected as a load.

A general transformer equivalent circuit is explained. Generally, a transformer equivalent circuit is known to be a circuit as shown in FIGS. 3A and 3B. That is, the equivalent circuit of the output transformer of FIG. 3A is as shown in FIG. 3B. FIG. 4 shows frequency characteristic in an audio frequency band (20 Hz to 20 kHz) by applying the audio output transformer to the equivalent circuit in FIG. 3B with a pure resistance of 6 ohms connected as a load. FIG. 4 shows flat characteristic in low and medium frequency range and monotonically decreasing characteristic in high frequency range.

Figure 5:
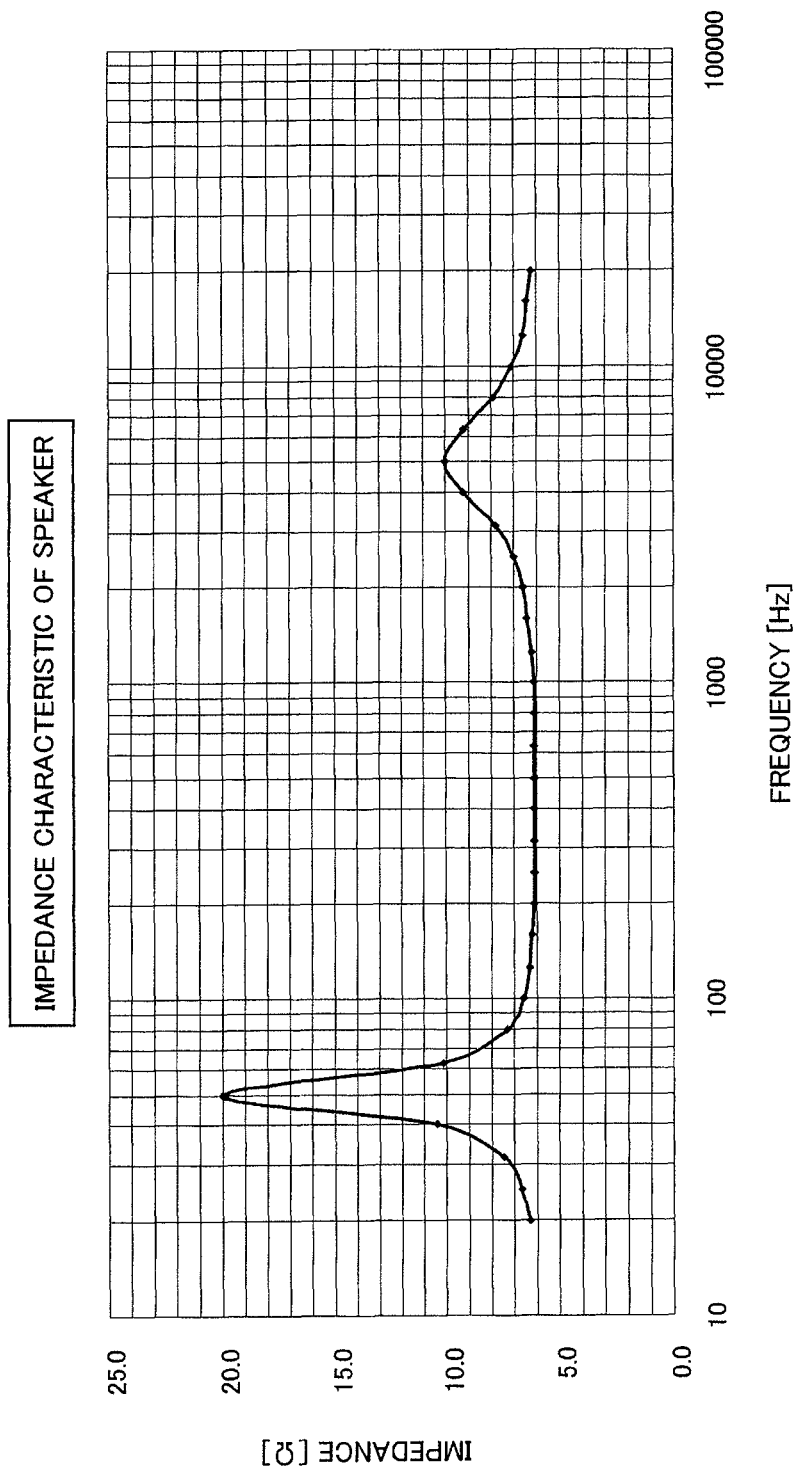
FIG. 5 is a diagram of an example of impedance characteristic of a speaker system.

FIG. 5 shows an example of impedance characteristic of a speaker system. The diagram shows the characteristic of a two-way speaker system composed of closed cabinet. By referring to FIG. 5, the lowest resonance frequency of this speaker system is 50 Hz, and the lowest resonance frequency of a high range reproduction speaker unit (tweeter) is 5 kHz.

Figure 6:
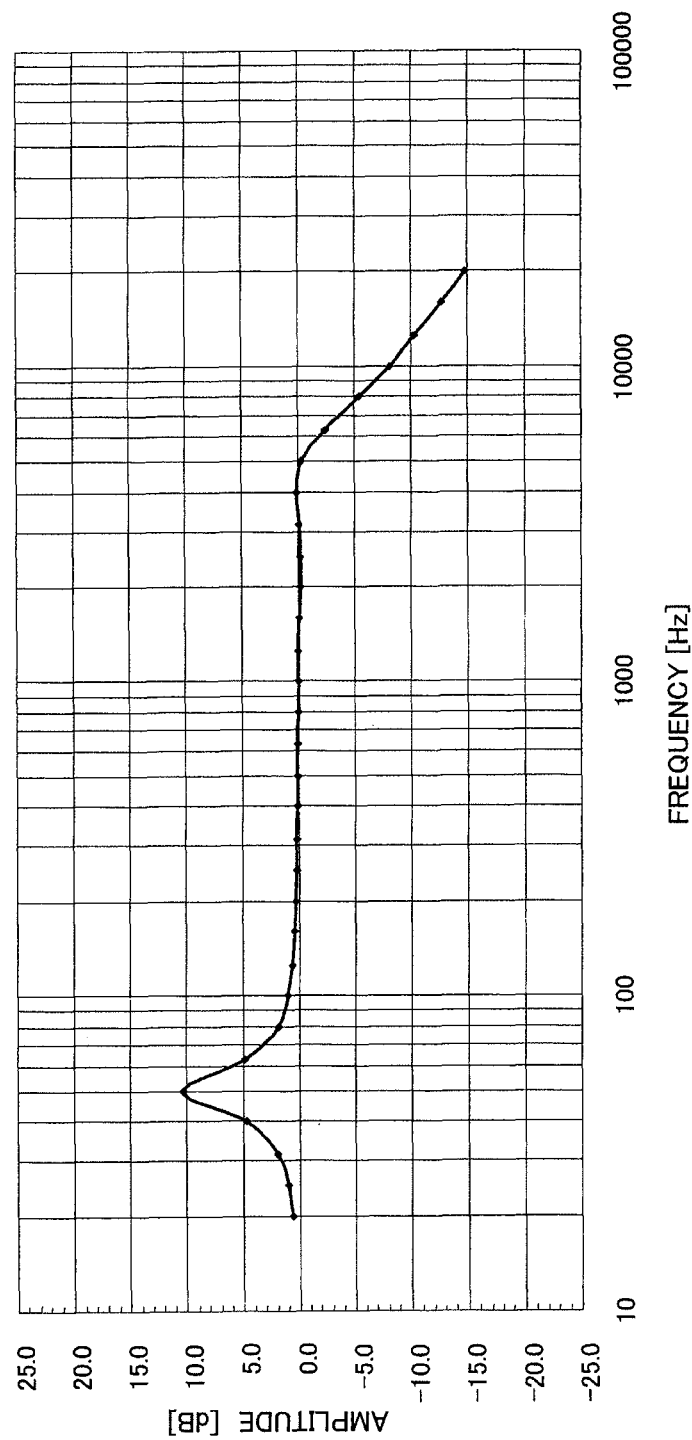
FIG. 6 is a diagram of frequency characteristic of output signal of the output transformer to which the speaker system having the impedance characteristic shown in FIG. 5 is connected.

FIG. 6 shows frequency characteristic of an output signal of the output transformer having the characteristic shown in FIG. 4 to which the speaker unit having the characteristic shown in FIG. 5 is connected. Comparing the characteristics between FIG. 4 and FIG. 6, FIG. 4 shows the characteristic that the amplitude of high frequency range monotonously decreases. FIG. 6 shows the characteristic that the amplitude partially rises in low and high frequency range due to the effects of the impedance of the speaker system. It could be considered that such changes in frequency characteristic due to difference in the load to be connected to the output transformer influences the sound quality, thereby generating tone timbre specific to the vacuum tube amplifier.

Thus, the signal processing circuit 100 of the embodiment processes the input audio signal based on the transfer characteristic of the output transformer simulator 101 when using a load which is simulated by the speaker impedance simulator 102 to generate the output signal having the frequency characteristic as shown in FIG. 6.

The characteristic of the speaker impedance simulator 102 may be determined as follows. For example, impedance characteristic of an actual speaker system (including a case for only a unit) is measured, and the impedance characteristic is determined based on the measured value. The speaker impedance simulator 102 stores the information of measured values of impedance characteristic as a table.

Figure 7B:
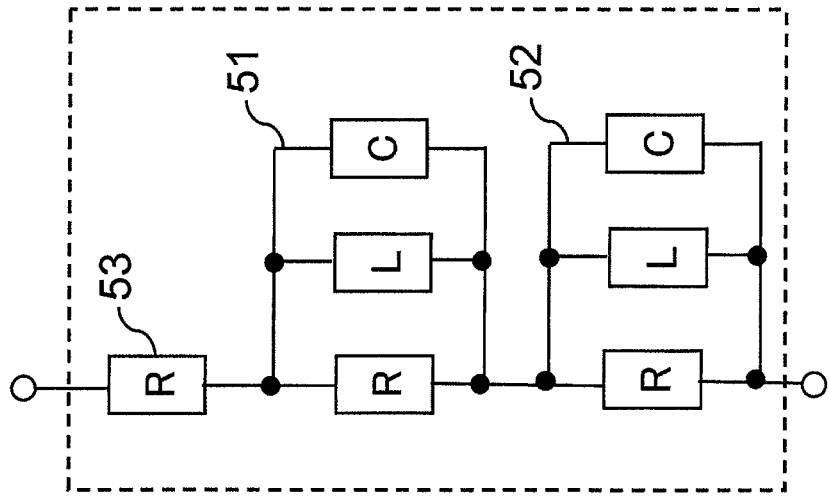
FIGS. 7A and 7B are diagrams of a structural example of a circuit used for simulating the speaker impedance by a speaker impedance simulator.
Figure 7A:
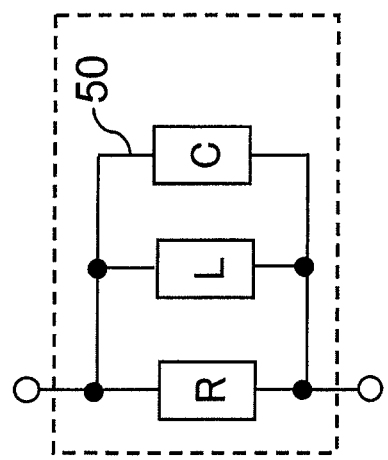

Alternatively, the impedance characteristic may be determined by simulating the impedance characteristic of the speaker by using a LCR resonance circuit. FIGS. 7A and 7B show a configuration of the circuit used in the simulation of impedance characteristic by the speaker impedance simulator 102. The circuit shown in FIG. 7A includes one stage of LCR parallel resonance circuit, which can be used, for example, for simulating a speaker system having one resonance point. The circuit shown in FIG. 7B includes two stages of LCR parallel resonance circuit, which is used, for example, for simulating a speaker system having two resonance points. The speaker impedance simulator 102 may obtain the impedance characteristic of the speaker system to be simulated by using the impedance characteristic given by the circuit shown in FIG. 7A or 7B. The values of L, C, R, the number of stages of resonance circuit, and the configuration of the resonance circuit may be determined depending on the impedance characteristic of the speaker system to be simulated. The values of L, C, and R in FIG. 7B may be mutually independent values depending on the impedance characteristic to be simulated.

The impedance characteristic may be determined by simulating the impedance characteristic of the speaker by using the parallel resonance circuit of L, C, R shown in FIG. 7A or 7B. For example, suppose the impedance of the speaker to be simulated is given by the circuit shown in FIG. 8A. In the circuit shown in the drawing, impedance $Z_0$ of the speaker is given in the following formula.

$$z_0 = R_4 + sL_5R_5/(s^2L_5C_5R_5 + sL_5 + R_5) \qquad (1)$$

Resonance frequency $f_0$ is given in the following formula.

$$f_0 = 1/\{2\pi(L_5C_5)^{1/2}\} \qquad (1.1)$$

The height of resonance peak (see FIG. 8B) is given by $R_5$, and the quality factor Q is given in the following formula.

$$Q = 1/[2\{1 + L_5/(4C_5R_5^2)\}^{1/2}] \qquad (1.2)$$

Figure 8A:
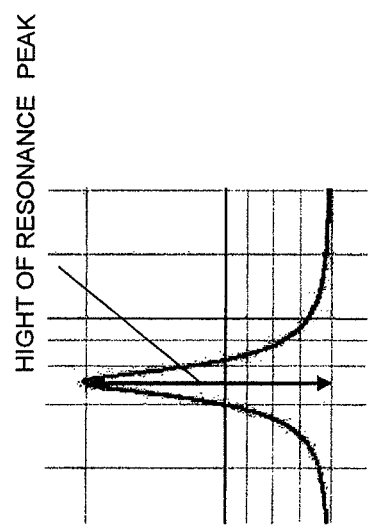
FIGS. 8A and 8B are circuit diagrams of an equivalent circuit used for simulating the speaker impedance.
Figure 8B:
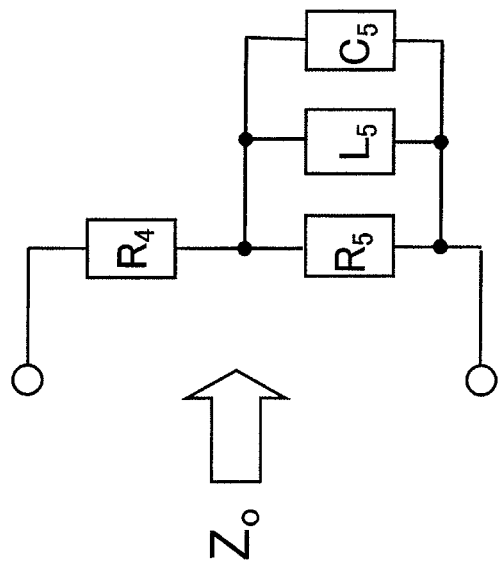

Hence, since the values of the resonance frequency, the height of resonance peak, and the quality factor can be arbitrarily determined by properly setting the values of $R_4$, $L_5$, $C_5$, $R_5$ of each element of the circuit shown in FIG. 8A, the speaker impedance ($Z_0$) characteristics may be determined as desired.

On the other hand, in the output transformer simulator 101, the transfer characteristics of an actual output transformer are measured similarly, and the frequency characteristic of the output transformer simulator 101 may be determined based on the measured values. For example, the transfer characteristic can be determined by using the equivalent circuit shown in FIG. 3B, and then the characteristic of the output transformer simulator 101 can be determined based on the transfer characteristic and the measured values. The transfer characteristic of the output transformer is described below.

Figure 9:
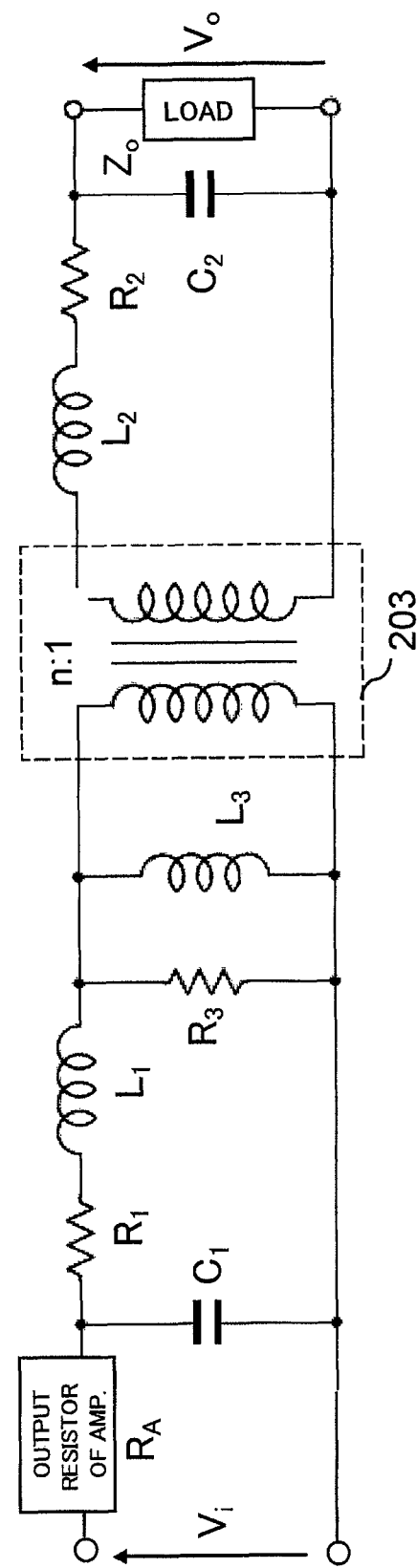
FIG. 9 is an equivalent circuit diagram of an output section of a vacuum tube amplifier to be simulated.

The following explanation discusses the transfer characteristic of the output transformer in consideration of an output resistor $R_A$ of the vacuum tube amplifier as shown in FIG. 9. The output resistor $R_A$ is a resistor of the vacuum tube device 201. Supposing the input voltage and the output voltage to be $V_i$, $V_o$ respectively, the transfer characteristic is given in the following formula;

$$V_i/V_o = \{(sC_1R_A+1)(R_1+sL_1)+R_A\}[(sL_3+R_3)\{(n^2R_2+sn^2L_2)(sC_2Z_0+1)+n^2Z_0\}+sL_3R_3(sC_2Z_0+1)]/sn^2L_3R_3Z_0+sL_3R_3(sC_1R_A+1)\{(R_2+sn^2L_2)(sC_2Z_0+1)+n^2Z_0\}/sL_3R_3n^2Z_0 \quad (2)$$

where $Z_0$ is load impedance, $C_1$ is primary winding floating capacitor, $R_1$ is primary winding resistance, $L_1$ is primary winding leak inductance, $R_3$ is iron loss, $L_3$ is primary impedance, $L_2$ is secondary winding leak inductance, $R_2$ is secondary winding resistance, $C_2$ is secondary winding floating capacitor, and n is winding ratio of output transformer.

In formula (2), the values of L, C, R are determined based on the measured values of transfer characteristic of the output transformer, but may be determined appropriately so as to obtain desired characteristics.

The load impedance $Z_0$ is generally given in formula (2.1). However, for example, when the impedance characteristic is simulated by using the equivalent circuit shown in FIG. 8(*a*), the load impedance $Z_0$ is given in formula (1).

$$Z_0 = (a_0 + a_1s + \ldots + a_ns^n)/(b_0 + b_1s + \ldots + b_ns^n) \quad (2.1)$$

Convolution of thus determined transfer characteristics in the input signal allows an output signal to be generated. Regarding the output characteristic with a speaker impedance to be simulated by the speaker impedance simulator 102 used as a load, the transfer characteristic may not be determined individually but may be determined with a speaker system connected to the output transformer.

Figure 10:
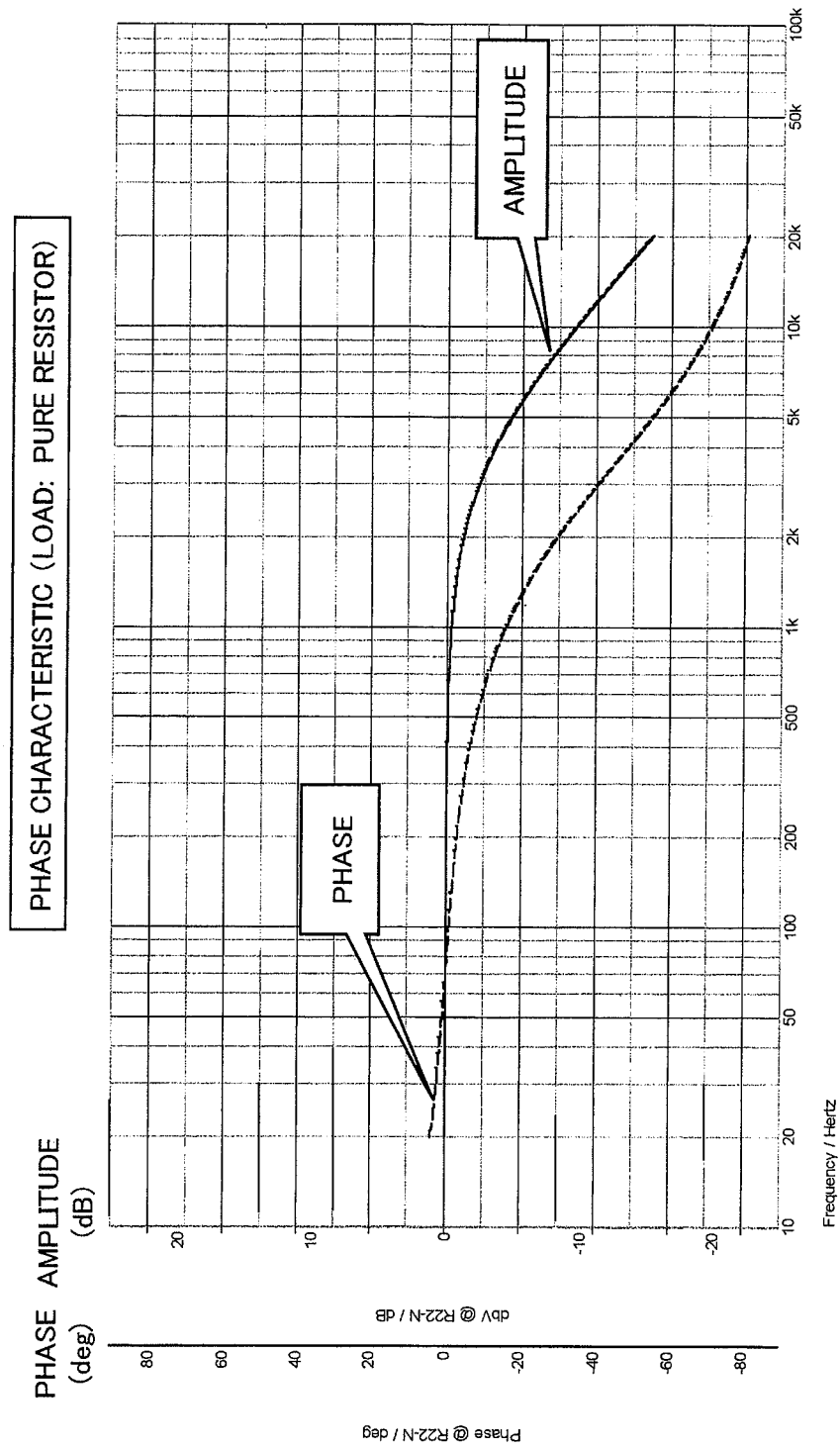
FIG. 10 is a diagram showing phase characteristic and amplitude characteristic of the output transformer to which a pure resistance is connected as a load.
Figure 11:
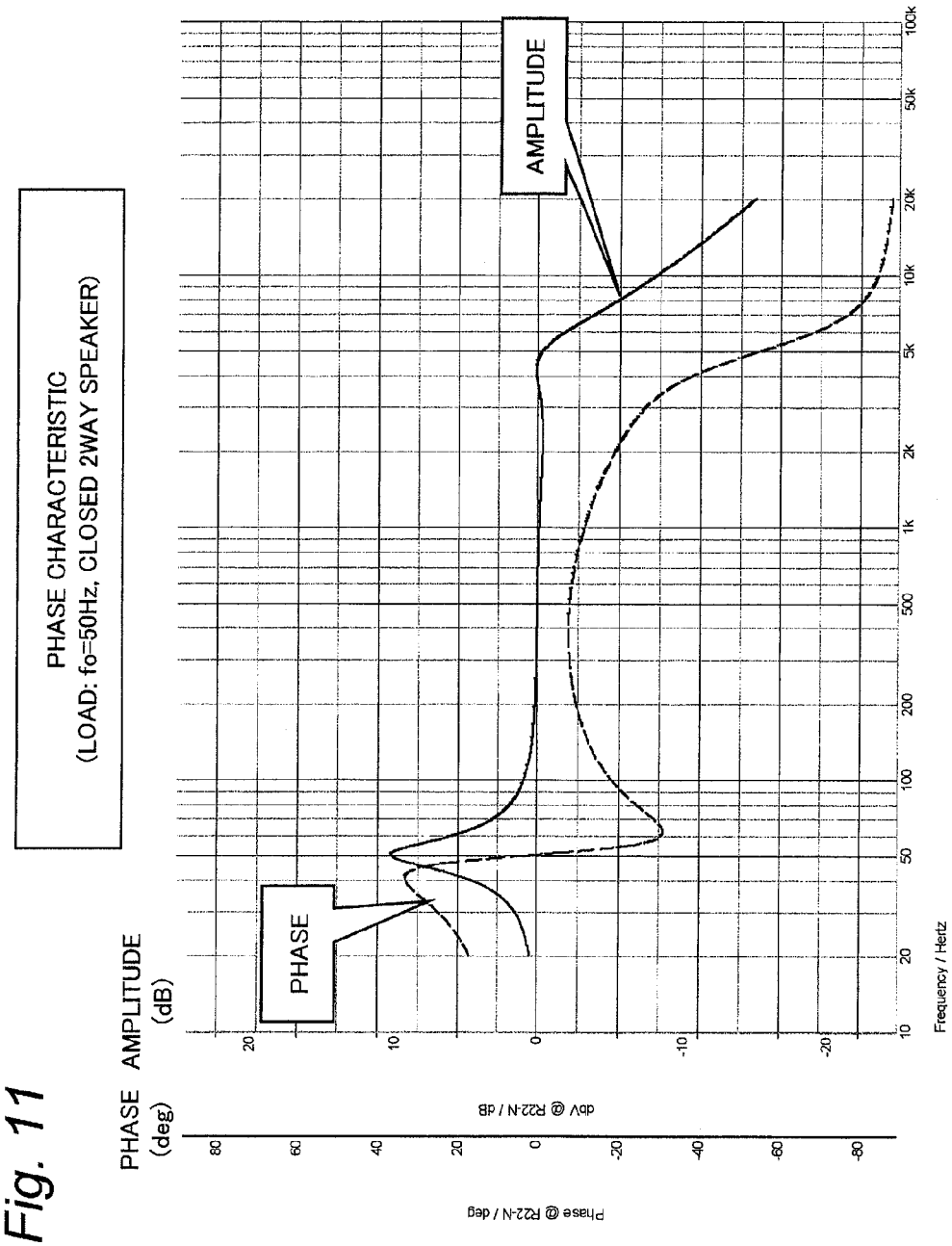
FIG. 11 is a diagram showing phase characteristic and amplitude characteristic of an output signal of the output transformer to which a closed two way speaker system is connected as a load.
Figure 12:
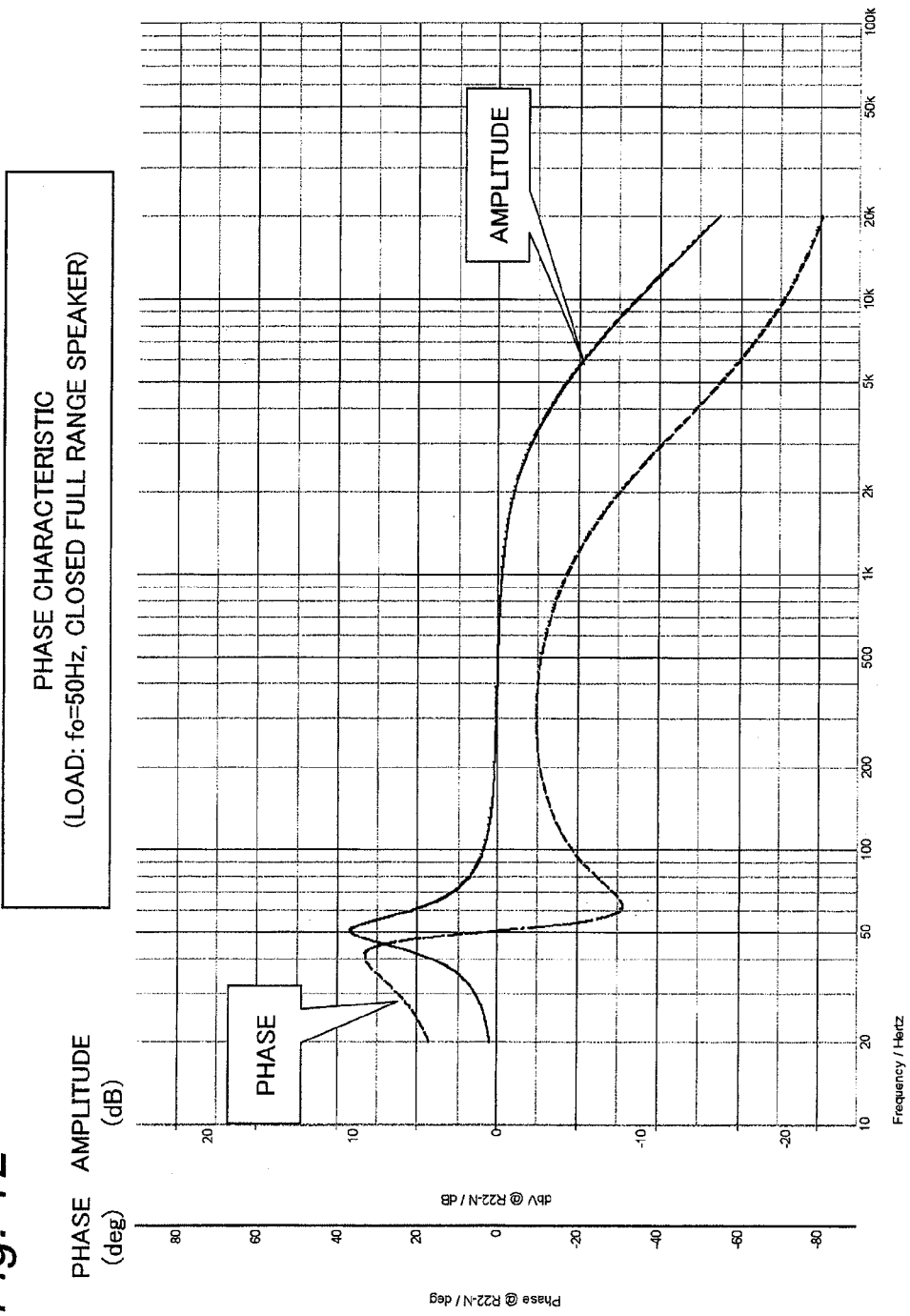
FIG. 12 is a diagram showing phase characteristic and amplitude characteristic of an output signal of the output transformer to which a closed full range speaker system is connected as a load.

FIG. 10 to FIG. 12 are diagrams showing the frequency characteristic (characteristics about the phase and amplitude) of the signal processing apparatus of the embodiment. FIG. 10 is a diagram showing frequency characteristic of the output signal of the output transformer to which a pure resistance is connected as a load. FIG. 11 is a diagram showing frequency characteristic of the output signal of the output transformer to which a closed type two-way speaker system having 50 Hz resonance frequency is connected as a load. FIG. 12 is a diagram showing frequency characteristic of the output signal of the output transformer to which a closed type full-range speaker system having 50 Hz resonance frequency is connected as a load. As shown in these diagrams, according to the signal processing apparatus of the embodiment, the phase also has frequency characteristic. The signal processing apparatus of the embodiment is different in having such phase characteristic from the graphic equalizer capable of adjusting the sound quality by increasing or decreasing the level in each band.

With the aforementioned configuration, the sound quality features of an analog audio apparatus, especially, a vacuum tube amplifier, can be regenerated by a digital audio apparatus. That is, the smooth, stable and easeful sound quality felt from sound reproduced from an analog audio apparatus can be presented.

In the signal processing apparatus 100 of the embodiment, control parameters for the output transformer simulator 101 and the speaker impedance simulator 102 can be changed respectively from outside by way of the control terminals T11 and T12.

The speaker impedance simulator 102 receives control parameters from outside by way of the control terminal T12 to change the speaker impedance characteristic. For example, when the speaker impedance simulator 102 simulates the impedance characteristic by using the circuit shown in FIG. 8A, the control parameters for setting the resonance frequency are $L_5$ and $C_5$ from the formula (1.1), and the control parameters for setting the quality factor Q are $L_5$, $C_5$, and $R_5$ from the formula (1.2).

Figure 13:
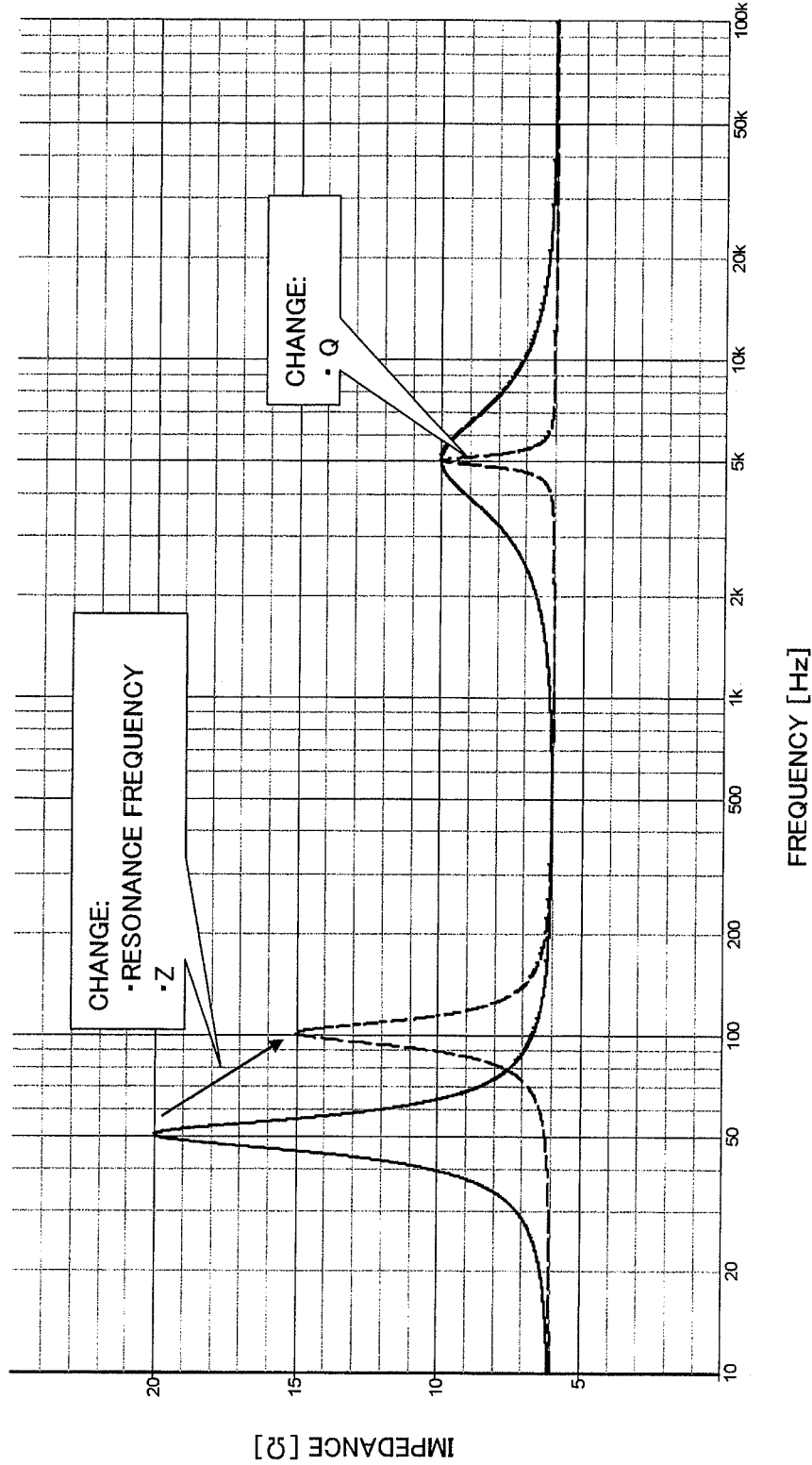
FIG. 13 is a diagram showing change in impedance characteristic depending on change in control parameters.

FIG. 13 is a diagram showing an example of changed impedance characteristic by varying the control parameters, when the speaker impedance simulator 102 simulates impedance characteristic of the speaker by using the circuit shown in FIG. 7B. In FIG. 13, the solid line indicates the characteristic before change, and the broken line represents the characteristic after change. FIG. 13 shows the impedance characteristic of a two-way speaker system with a closed cabinet.

Figure 14:
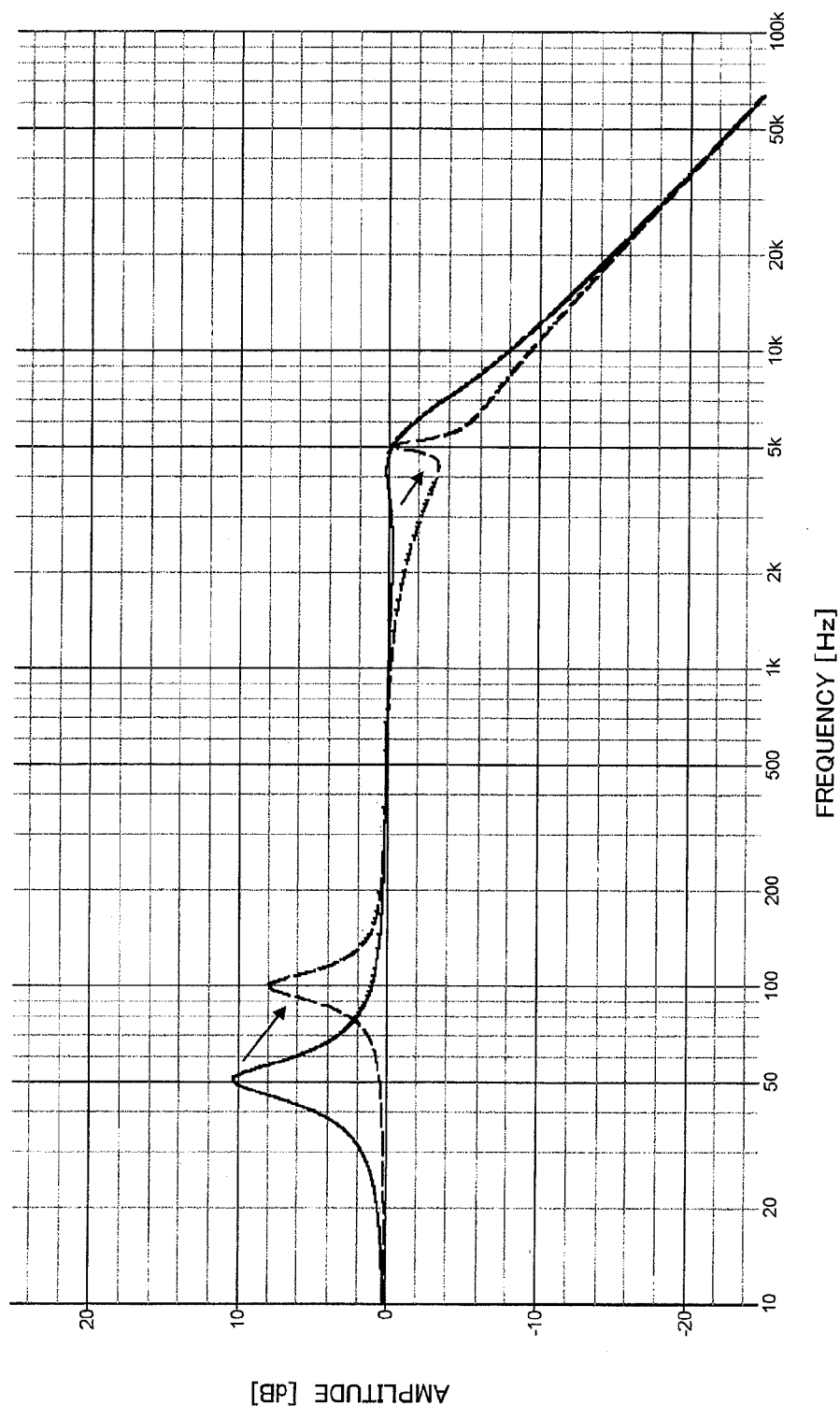
FIG. 14 is a diagram showing output signal characteristic of the output transformer according to the change in impedance characteristic shown in FIG. 13.

In FIG. 13, three elements are changed in order to control the impedance characteristic. The first element is a resonance frequency, and the resonance frequency in low range is shifted to a higher frequency (from 50 Hz to 100 Hz). The second element is magnitude of impedance at resonance in low range, which is set smaller. The third element is the quality factor Q, and the quality factor Q of the impedance at a low frequency (5 kHz) of the tweeter is increased. When the speaker impedance is changed in this way, the frequency characteristic of the output signal of the output transformer with a load having such speaker impedance will be changed as shown in FIG. 14. In FIG. 14, the solid line indicates the characteristic before change, and the broken line represents the characteristic after change.

Control of the impedance characteristic of the speaker in the above stated manner enables control of the frequency characteristic of the output transformer using the speaker as a load.

Figure 15:
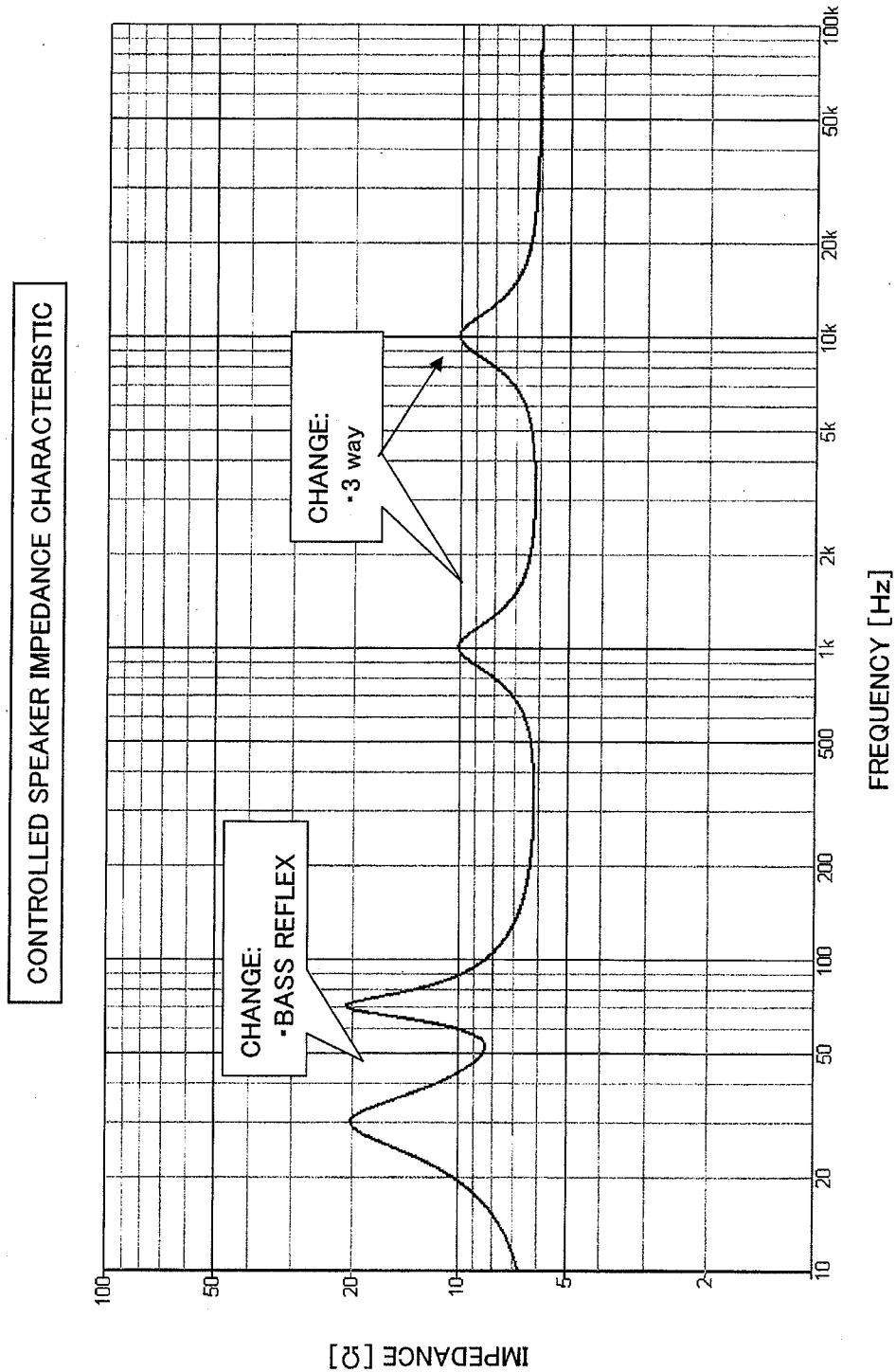
FIG. 15 is a diagram showing impedance characteristic of a bass reflex enclosure three-way speaker system obtained by change of control parameter.
Figure 16:
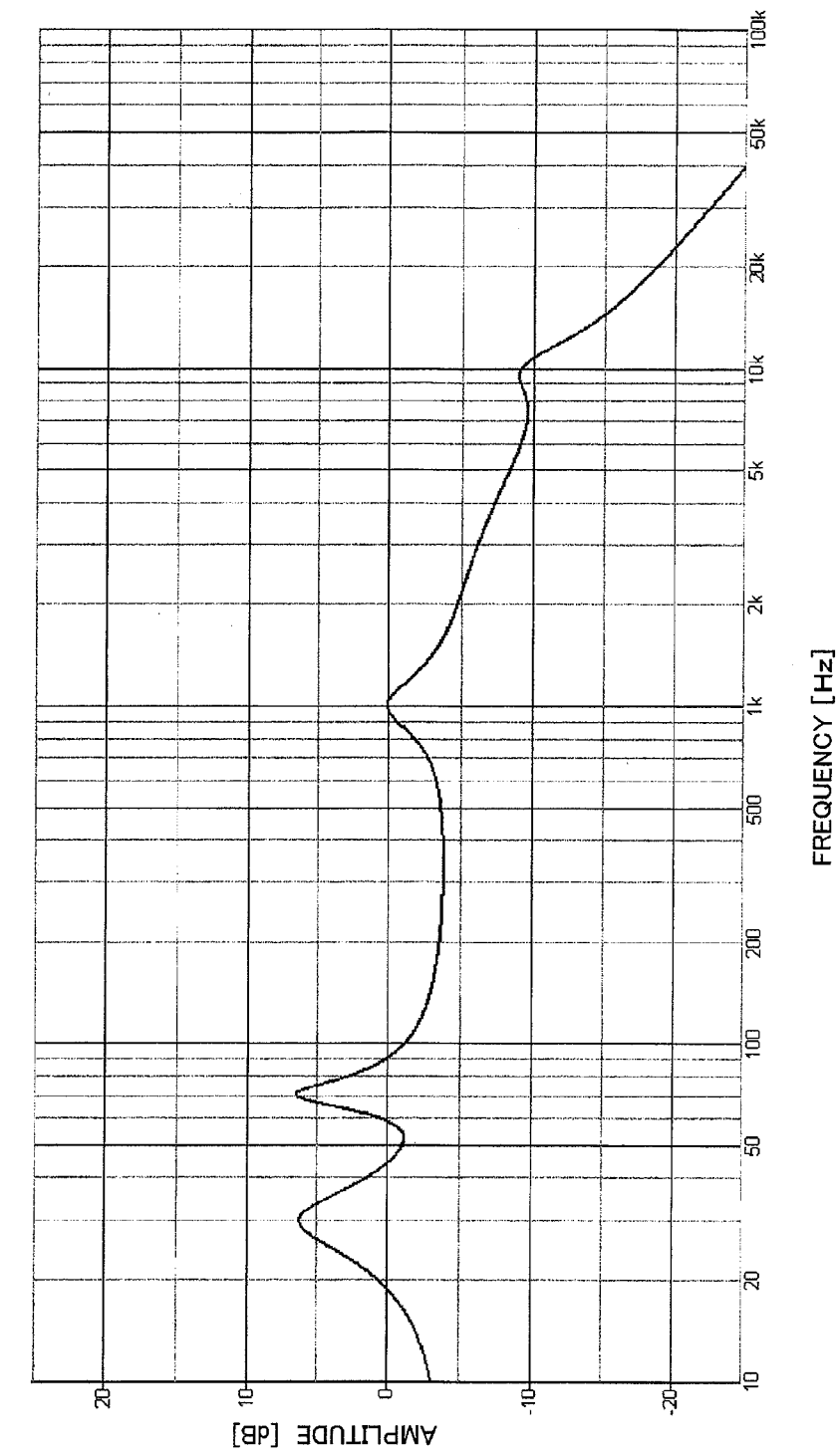
FIG. 16 is a diagram showing an output signal characteristic of the output transformer to which a load with the impedance characteristic shown in FIG. 15 is connected.

In the above control, the characteristic which is feature of the speaker impedance is controlled. However, actually transfer characteristics of a plurality of speaker impedances are stored in the speaker impedance simulator 102 as a table, and any one of the transfer characteristics may be selected by the control parameter and used. For example, the impedance characteristic of the closed two-way speaker system shown in FIG. 13, and the impedance characteristic of the bass-reflex three-way speaker system shown in FIG. 15 may be stored respectively, and either one of the characteristics may be selected by the control parameter. FIG. 16 shows the frequency characteristic of the output signal, by the transformer simulator 101, for the output transformer connected to the speaker system having the impedance characteristic as shown in FIG. 15.

As discussed above, it is possible to control the sound quality of the reproduced sound from outside by configuring the signal processing apparatus to control the control parameters from outside through the control terminals T11, T12 so as to control the impedance characteristic of the speaker. In this manner, changing only the control parameters can change the impedance characteristic of the speaker easily, and thus the characteristics of a plurality of speaker systems can be obtained easily, so that the sound quality can be regenerated easily when various speakers are used. In addition, the low range resonance frequency of the speaker impedance may be set at low level with the control parameters and the impedance value at the low-range resonance frequency may be set at high value. This enables enhancement of the audible sound quality (low-range reproduction ability) when the sound is reproduced by a speaker having low reproduction ability in low frequency range (narrow frequency characteristic in low frequency range).

Figure 17:
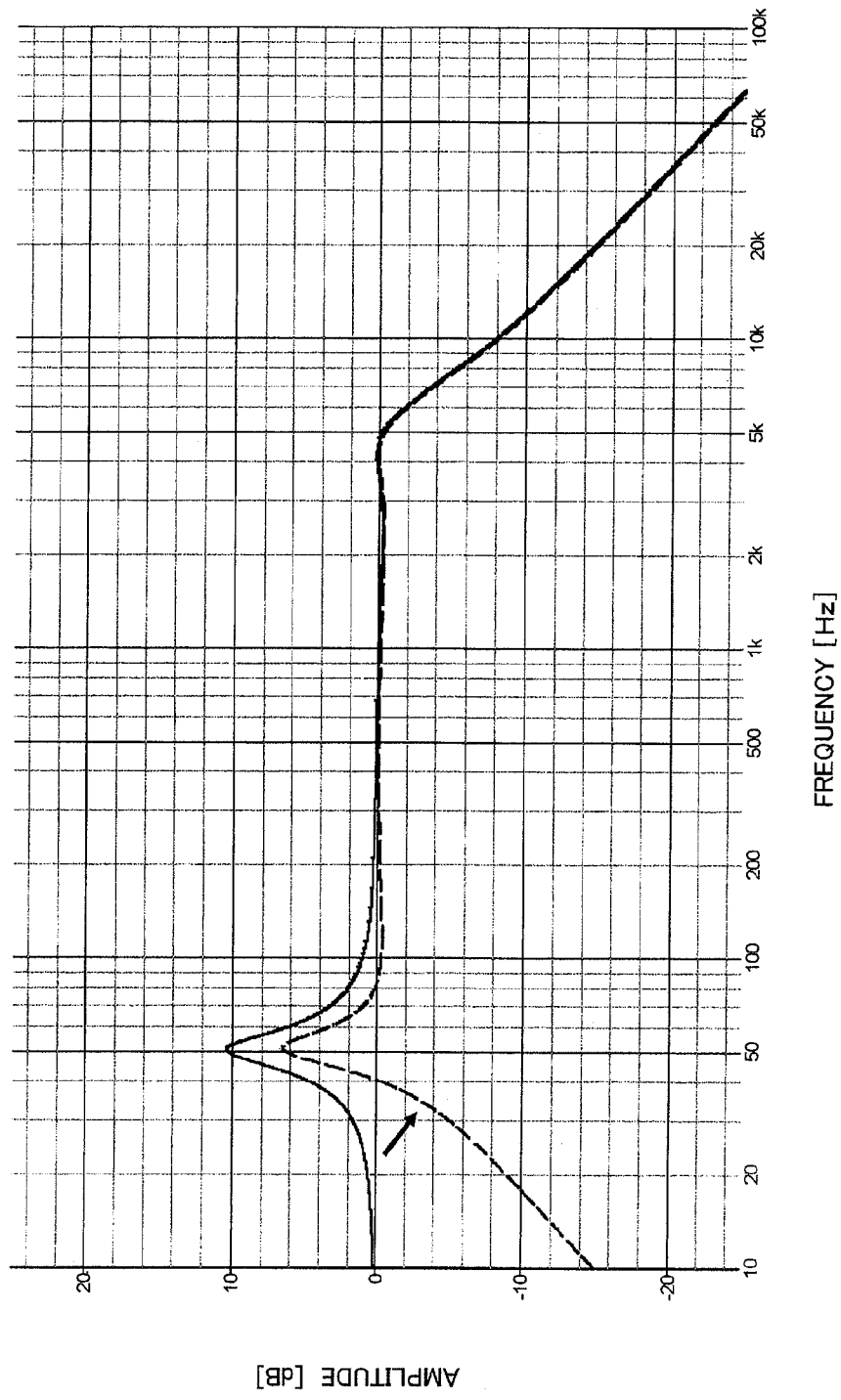
FIG. 17 is a diagram showing change in output signal characteristic of the output transformer with the primary inductance changed.
Figure 18:
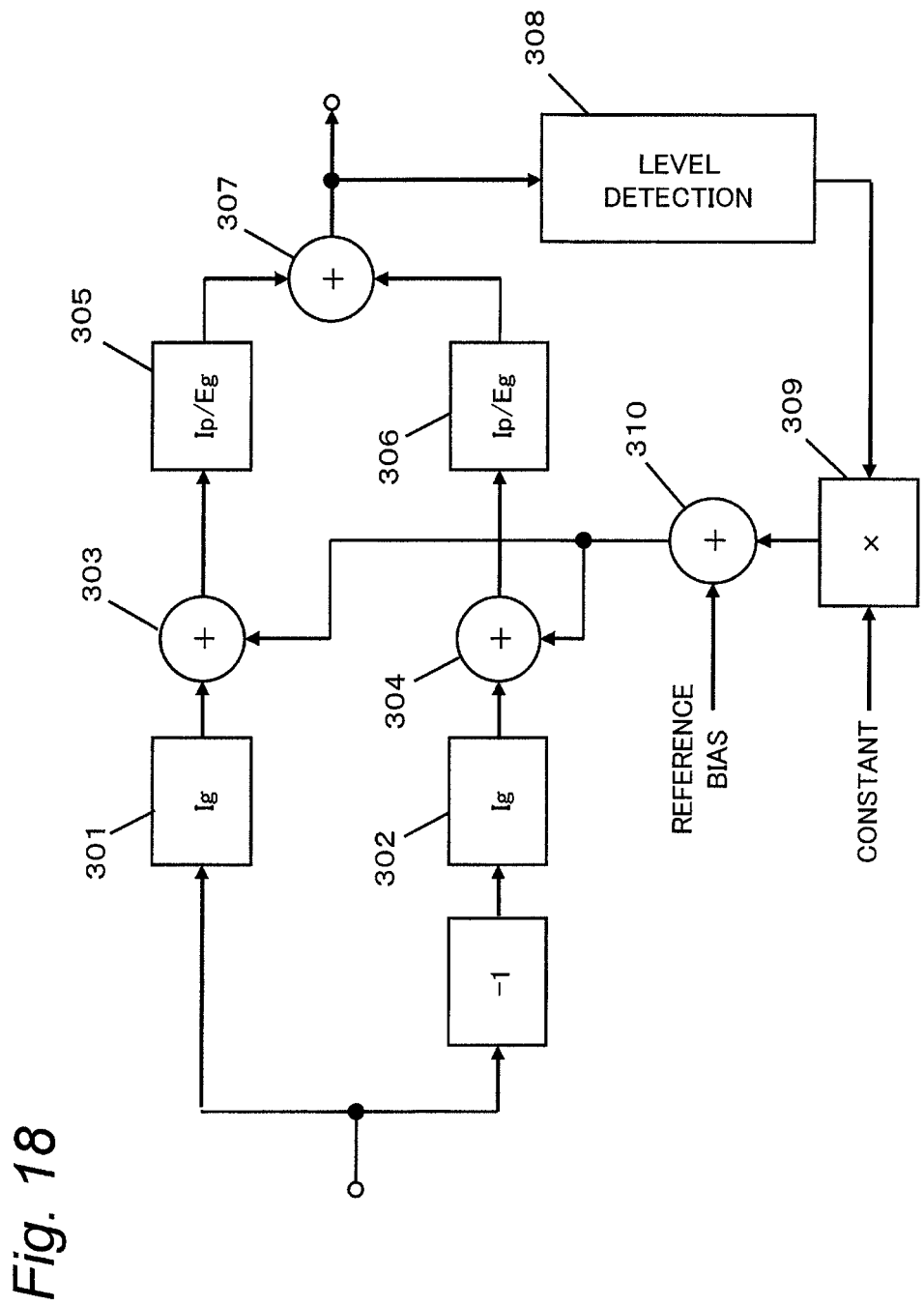
FIG. 18 is a block diagram of configuration of a conventional audio signal reproducing apparatus.

The transformer simulator 101 receives a control parameter from outside through the control terminal T11 to change the characteristics of the output transformer to be simulated. More specifically, for example, the transfer characteristics calculated from a plurality of output transformers may be stored in a table, and any one of the transfer characteristics can be selected by the control parameter. Alternatively, parameters (values of L, C and R) influencing sound quality in the transfer characteristic of the equivalent circuit shown in FIG. 9 may be varied stepwise or continuously by the control parameter to control the sound quality of the reproduced sound. In particular, by changing the primary inductance $L_3$ (for example, decreasing), the characteristic in the low frequency range of the output signal of the output transformer may be changed as shown in FIG. 17.

According to the aforementioned configuration, the tone features of the analog audio apparatus, especially, the vacuum tube amplifier can be generated by a digital audio apparatus so that smooth, stable and easeful sound quality felt from sound reproduced by an analog audio apparatus can be obtained. Further, the simulation characteristic can be controlled from outside so that the obtained sound quality can be controlled.

3. Modified Examples

In the foregoing embodiment, the signal processing apparatus 100 is implemented by hardware of a digital signal processing circuit, but the concept of the present invention may be limited to this. For example, the configuration of FIG. 1 may be implemented by a signal processing program (software), and its signal processing program may be executed by a DSP (digital signal processor).

In the foregoing explanation, the output characteristic of the output transformer included in the vacuum tube amplifier is simulated, but it is not limited to the vacuum tube amplifier. It is also possible to simulate output characteristic of an output transformer included in other analog audio apparatus. When the output transformer included in the analog audio apparatus influences significantly the characteristics of the analog audio apparatus, simulation of the output characteristics of the output transformer can regenerate the sound quality by the analog audio apparatus.

4. Summary

As described herein, according to the signal processing apparatus of the present invention, an input audio signal is processed with the transfer characteristic for a condition in which a load having predetermined characteristic is connected to a transformer having predetermined characteristic to generate an output audio signal. In particular, by using the total transfer characteristic including the transfer characteristic of the output transformer and the impedance characteristic of the speaker connected thereto, the input audio signal is processed to generate an output audio signal. In this configuration, by using an output transformer of an audio vacuum tube amplifier as a transformer to be simulated, and an audio speaker as a load to be simulated, it is possible to regenerate sound quality obtained in a condition of driving the speaker by a vacuum tube amplifier.

Further, it is possible to generate audio signals when various output transformers and speakers are combined (including a combination example of noted audio apparatuses), by controlling the frequency characteristic of the speaker impedance from outside to change the resonance frequency of the impedance characteristic, and by controlling the characteristics including the primary inductance of the transformer from outside.

Moreover, in the embodiment, the low-range resonance frequency and magnitude of the impedance for the speaker as the load can be adjusted appropriately. More specifically, the low-range resonance frequency of the impedance of the speaker is set before and after the low-range regeneration limit of a reproducing apparatus, or to a desired frequency to be controlled for sound quality, so as to change the magnitude of the impedance. In this manner, the frequency characteristic near the set frequency can be adjusted. As a result, control of low-range characteristic of a reproducing apparatus, particularly low-range characteristic of a reproducing apparatus employing a small-sized speaker, can be improved.

INDUSTRIAL APPLICABILITY

The signal processing apparatus of the present invention allows a digital audio apparatus to regenerate tone features of analog audio apparatus, especially a vacuum tube amplifier, so as to regenerate smooth, stable and easeful sound quality which can be felt from reproduced sound of an analog audio apparatus. Therefore it is very useful for improving sound quality of an audio apparatus.

The present invention has been described in connection with specified embodiments thereof. However many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2006-312595, filed on Nov. 20, 2006, which is expressly incorporated herein by reference in its entirety.

The invention claimed is:

1. A signal processing device comprising:
  a transformer simulator for simulating transfer characteristic of a transformer which changes in frequency characteristic depending on a load connected to the transformer and processing an input signal with the transfer characteristic to output the processed signal; and
  a load impedance simulator for simulating impedance characteristic of a predetermined load to output the impedance characteristic,
  wherein the transformer simulator simulates the transfer characteristic of the transformer to which the load having the load impedance which is simulated by the load impedance simulator is connected, by using transfer characteristic of an equivalent circuit comprising an ideal transformer having winding ratio of the transformer to be simulated, and, primary inductance, primary winding leak inductance, primary winding resistance, primary winding floating capacitor, secondary winding leak inductance, secondary winding resistance, and secondary winding floating capacitor, which are parameters specific to the transformer to be simulated, iron loss, and
  in the equivalent circuit, the iron loss and the primary impedance are connected in parallel to the primary side of the ideal transformer, a series circuit including a primary winding leak inductance, a primary winding resistance, and a primary winding floating capacitor is connected in parallel to the iron loss, the input signal is applied across the primary winding floating capacitor, a secondary winding leak inductance, a secondary winding resistance, and a secondary winding floating capacitor are connected in series to the secondary side of the ideal transformer, and the load is connected across the secondary winding floating capacitor.

2. The signal processing device according to claim 1, wherein the load impedance simulator simulates the impedance characteristic of the audio speaker by using impedance characteristic of a series circuit including a resistor forming a direct-current resistance of the impedance of the audio speaker, and at least one resonance circuit including a resistor, a capacitor and an inductor.

3. The signal processing device according to claim 2 further comprising a control terminal for controlling, from outside, the impedance characteristic of the load to be simulated by the load impedance simulator.

4. The signal processing device according to claim 2 further comprising a control terminal for controlling, from outside, primary inductance characteristic of the transformer to be simulated by the transformer simulator.

5. The signal processing device according to claim 1 further comprising a control terminal for controlling, from outside, the impedance characteristic of the load to be simulated by the load impedance simulator.

6. The signal processing device according to claim 1 further comprising a control terminal for controlling, from outside, primary inductance characteristic of the transformer to be simulated by the transformer simulator.

7. A signal processing device comprising:
a transformer simulator for simulating transfer characteristic of a transformer which changes in frequency characteristic depending on a load connected to the transformer and processing an input signal with the transfer characteristic to output the processed signal; and
a load impedance simulator for simulating impedance characteristic of a predetermined load to output the impedance characteristic, wherein the transformer simulator simulates the transfer characteristic of the transformer to which the load having the load impedance which is simulated by the load impedance simulator is connected, and the load impedance simulator simulates the impedance characteristic of the audio speaker by using impedance characteristic of a series circuit including a resistor forming a direct-current resistance of the impedance of the audio speaker, and at least one resonance circuit including a resistor, a capacitor and an inductor.

8. The signal processing device according to claim 7 further comprising a control terminal for controlling, from outside, the impedance characteristic of the load to be simulated by the load impedance simulator.

9. The signal processing device according to claim 7 further comprising a control terminal for controlling, from outside, primary inductance characteristic of the transformer to be simulated by the transformer simulator.

10. A signal processing method comprising:
simulating an impedance characteristic of a predetermined load;
simulating a transfer characteristic of a transformer which changes in frequency characteristic depending on a load connected to the transformer, by using the simulated impedance characteristic of the predetermined load; and
processing an input signal with the simulated transfer characteristic to generate an output signal.

11. The signal processing method according to claim 10, wherein the transformer is an output transformer used in an audio vacuum tube amplifier.

12. The signal processing method according to claim 10, wherein the load is an audio speaker.

13. The signal processing method according to claim 10, further comprising receiving control information for controlling the impedance characteristic of the load.

14. The signal processing method according to claim 10, further comprising receiving control information for controlling the primary inductance characteristic of the transformer.

* * * * *